(12) United States Patent
Kawaguchi et al.

(10) Patent No.: US 8,552,802 B2
(45) Date of Patent: Oct. 8, 2013

(54) AMPLIFYING CIRCUIT AND CURRENT-VOLTAGE CONVERSION CIRCUIT

(75) Inventors: Tsuyoshi Kawaguchi, Osaka (JP); Norimasa Kitagawa, Osaka (JP); Mamoru Sekiya, Osaka (JP); Naofumi Shimasaki, Osaka (JP); Yu Takehara, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 22 days.

(21) Appl. No.: 13/190,591

(22) Filed: Jul. 26, 2011

(65) Prior Publication Data
US 2012/0049895 A1 Mar. 1, 2012

(30) Foreign Application Priority Data

Aug. 27, 2010 (JP) ................................ 2010-191452
Aug. 27, 2010 (JP) ................................ 2010-191453
May 31, 2011 (JP) ................................ 2011-121134
May 31, 2011 (JP) ................................ 2011-121135

(51) Int. Cl.
*H03F 3/26* (2006.01)
(52) U.S. Cl.
USPC .......................................... 330/265; 330/267
(58) Field of Classification Search
USPC .................................. 330/265, 311, 267, 310
See application file for complete search history.

(56) References Cited

U.S. PATENT DOCUMENTS

| | | | |
|---|---|---|---|
| 3,448,395 A | 6/1969 | Webb | |
| 5,444,419 A * | 8/1995 | Honda | 330/266 |
| 6,724,270 B2 * | 4/2004 | Kozu | 331/117 R |
| 6,882,225 B2 * | 4/2005 | Deletraz | 330/263 |
| 8,242,844 B2 * | 8/2012 | Rafi | 330/277 |

FOREIGN PATENT DOCUMENTS

| | | |
|---|---|---|
| JP | 06-232651 | 8/1994 |
| JP | 06-276037 | 9/1994 |
| JP | 2010-035117 | 2/2010 |
| WO | 98/08302 A1 | 2/1998 |
| WO | 2005/114832 A1 | 12/2005 |

OTHER PUBLICATIONS

"Precision Rail-to-Rail Input and Output Operational Amplifiers OP184/OP284/OP484", [online], Analog Devices, Inc, [searched on Sep. 10, 2010], Figure 44, <URL: http//www.analog.com.static/imported-files/data_sheets/OP184_284_484_pdf>.

(Continued)

*Primary Examiner* — Henry Choe
(74) *Attorney, Agent, or Firm* — Renner, Otto, Boisselle & Sklar, LLP

(57) ABSTRACT

An amplifying circuit comprises: a first transistor, a second transistor, a third transistor and a fourth transistor provided to an input stage; and a first bias circuit. The input signal is input into a control terminal of the first transistor and a control terminal of the second transistor, a first terminal of the first transistor is connected to a first terminal of the third transistor, a first terminal of the second transistor is connected to a first terminal of the fourth transistor, a second terminal of the first transistor is connected to a first potential, a second terminal of the second transistor is connected to a second potential that is equal to or different from the first potential, a second terminal of the third transistor is connected to a third potential, a second terminal of the fourth transistor is connected to a fourth potential, the first bias circuit is connected between a control terminal of the third transistor and a control terminal of the fourth transistor.

11 Claims, 12 Drawing Sheets

(56) References Cited

OTHER PUBLICATIONS

High Speed, Current-Feedback Operational Amplifier OPA603 URL:http://www.classiccmp.org/rtellason/chipdata/opa603.pdf; 1989.

National Semiconductor Corporation; LM6181 100 mA, 100 MHz Current Feedback Amplifier; 2004.

European Office Action for corresponding European Application No. 11 173 792.0 issued Dec. 11, 2012.

\* cited by examiner

AMPLIFYING CIRCUIT AND CURRENT-VOLTAGE CONVERSION CIRCUIT

BACKGROUND OF THE INVENTION

1. Field of the Invention

The present invention relates to an amplifying circuit and a current-voltage conversion circuit.

2. Description of the Related Art

In general current feedback amplifiers, a PNP transistor and an NPN transistor are provided to an input stage, and an input signal is supplied to a base of the PNP transistor and a base of the NPN transistor. A collector of the PNP transistor is connected to a negative power source, and a collector of the NPN transistor is connected to a positive power source. An emitter of the PNP transistor is connected to the positive power source via a first bias circuit (first constant current circuit), and an emitter of the NPN transistor is connected to the negative power source via a second bias circuit (second constant current circuit). Thus, in general current feedback amplifiers, since a plurality of bias circuits composed of constant current circuits should be provided, a number of parts increases, and a circuit configuration becomes complicated.

SUMMARY OF THE INVENTION

It is an object of the present invention to provide an amplifying circuit that can be simplified.

An amplifying circuit according to the present invention amplifies an input signal input from an input terminal and outputting the signal from an output terminal. The circuit comprises: a first transistor, a second transistor, a third transistor and a fourth transistor provided to an input stage; and a first bias circuit. The input signal is input into a control terminal of the first transistor and a control terminal of the second transistor, a first terminal of the first transistor is connected to a first terminal of the third transistor, a first terminal of the second transistor is connected to a first terminal of the fourth transistor, a second terminal of the first transistor is connected to a first potential, a second terminal of the second transistor is connected to a second potential that is equal to or different from the first potential, a second terminal of the third transistor is connected to a third potential, a second terminal of the fourth transistor is connected to a fourth potential, the first bias circuit is connected between a control terminal of the third transistor and a control terminal of the fourth transistor.

In this case, since the first bias circuit is connected between the control terminal of the third transistor and the control terminal of the fourth transistor, a voltage between the control terminals of the third transistor and the fourth transistor can be fixed by the first bias circuit. Therefore, a plurality of bias circuits does not have to be used as a power standard. That is to say, since only the one first bias circuit may be used, a circuit configuration can be simplified. Since only the one first bias circuit is used, a stability of the voltage between the control terminals can be made to be higher than a case using a plurality of bias circuits.

The first bias circuit is provided between the third transistor and the fourth transistor, so that the first bias circuit can compensate changed temperatures of the first transistor, the second transistor, the third transistor and the fourth transistor. As a result, temperature stability in the amplifying circuit according to the present invention can be improved. When a signal that suddenly changes is input into an input and transient response characteristics of the third transistor and the fourth transistor are not satisfactory, the signal is not transmitted. When a bias circuit is a constant current circuit, drive currents of the third transistor and the fourth transistor are limited by the constant current circuit. However, when the bias circuit is a constant voltage circuit, the drive currents are not limited, and thus the third transistor and the fourth transistor can be driven.

Preferably the amplifying circuit further comprises: a first resistor, a second resistor, a third resistor and a fourth resistor. The first resistor is connected between the first terminal of the first transistor and the first terminal of the third transistor, the second resistor is connected between the first terminal of the second transistor and the first terminal of the fourth transistor, the third resistor is connected to the second terminal of the third transistor, the fourth resistor is connected to the second terminal of the fourth transistor.

In this case, an amplifying amount of the input stage can be determined based on a ratio of the first resistor and the third resistor, and a ratio of the second resistor and the fourth resistor. Linearity of the amplification can be improved by the ratio of the first resistor and the third resistor, and the ratio of the second resistor and the fourth resistor.

Preferably, the amplifying circuit further comprises: a fifth transistor, a sixth transistor, a seventh transistor and an eighth transistor. A control terminal of the fifth transistor is connected to the second terminal of the third transistor, a control terminal of the sixth transistor is connected to a first terminal of the fifth transistor, a control terminal of the seventh transistor is connected to the second terminal of the fourth transistor, a control terminal of the eighth transistor is connected to a first terminal of the seventh transistor, a first terminal of the fifth transistor and a first terminal of the sixth transistor are connected to the third potential, a first terminal of the seventh transistor and a first terminal of the eighth transistor are connected to the fourth potential, a second terminal of the fifth transistor is connected to a fifth potential or a second terminal of the sixth transistor, a second terminal of the seventh transistor is connected to a sixth potential or a second terminal of the eighth transistor, the second terminal of the sixth transistor and the second terminal of the eighth transistor are connected to the output terminal of the amplifying circuit.

In this case, since Darlington connection is made between the fifth transistor and the sixth transistor and between the seventh transistor and the eighth transistor, an amplification factor of the electric current in the circuit can be heightened.

Further, drive of a capacitor load to be connected to an output terminal OUT depends on a current value of the output. For this reason, an output signal can be instantaneously obtained despite a low electric current at stationary time in the sixth transistor, thereby achieving a satisfactory slew rate.

Preferably, the amplifying circuit further comprises: a negative feedback resistor. A negative feedback signal from the output terminal is supplied to the control terminal of the first transistor and the control terminal of the second transistor via the negative feedback resistor.

In this case, the amplifying circuit of the inverting circuit can be formed, and a noise and a distortion can be reduced by a negative feedback resistor. Since the negative feedback resistor also has a function of an output resistor, the circuit can be simplified.

Preferably, the amplifying circuit further comprises: a ninth transistor, a tenth transistor, an eleventh transistor, a twelfth transistor, a second bias circuit and a third bias circuit. A control terminal of the ninth transistor is connected to the second terminal of the third transistor, a first terminal of the ninth transistor is connected to a first terminal of the tenth transistor, a second terminal of the ninth transistor is connected to the third potential, a control terminal of the eleventh transistor is connected to the second terminal of the fourth transistor, a first terminal of the eleventh transistor is connected to a first terminal of the twelfth transistor, a second terminal of the eleventh transistor is connected to the fourth potential, a second terminal of the tenth transistor and a second terminal of the twelfth transistor are connected to the output terminal, the second bias circuit is connected between the third potential and a control terminal of the tenth transistor, the third bias circuit is connected between the fourth potential and a control terminal of the twelfth transistor.

In this case, since the second bias circuit and the third bias circuit are provided to the output stage, a bias current at the output stage can be independently designed. As a result, a degree of freedom in the circuit can be heightened.

Preferably, a negative feedback signal from the output terminal is supplied to a reference point of the first bias circuit.

When the amplifying circuit is a non-inverting circuit, the negative feedback signal is connected to a reference point of the first bias circuit. As a result, the reference point of the first bias circuit in the non-inverting circuit is adjusted so that the standard of the first bias circuit is changed, and the output can be stabilized.

Preferably, the amplifying circuit further comprising: a short-circuit protection circuit, the short-circuit protection circuit includes a thirteenth transistor connected between the control terminal of the third transistor and the control terminal of the fourth transistor, the thirteenth transistor is controlled from an off state into an on state according to an external signal so that the control terminal of the third transistor and the control terminal of the fourth transistor are short-circuited.

In this case, the thirteenth transistor can be controlled to be changed from an off state into an on state according to the external signal, so that the control terminals of the third transistor and the fourth transistor are short-circuited. For this reason, the first bias circuit is stopped. For example, the external signal is output at abnormal time (including zero output), so that the amplifying circuit is easily stopped and protected.

A current-voltage conversion circuit according to the present invention, comprises: a first transistor provided to an input stage; a second transistor provided to the input stage and has polarity different from that of the first transistor; and a bias circuit. A first terminal of the first transistor and a first terminal of the second transistor are connected to an input terminal into which an input current is input, a second terminal of the first transistor is connected to a first predetermined potential, a second terminal of the second transistor is connected to a second predetermined potential, the bias circuit is connected between the control terminal of the first transistor and the control terminal of the second transistor.

In this case, the bias circuit is connected between the control terminal of the first transistor and the control terminal of the second transistor. For this reason, the bias circuit is in a pulled-up state (also called as a floating state), and a plurality of bias circuits does not have to be provided, thereby simplifying the circuit configuration.

Since the bias circuit can be provided between the first transistor and the second transistor, the bias circuit can compensate the changed temperatures of the first transistor and the second transistor. As a result, the temperature stability in the current-voltage conversion circuit according to the present invention can be improved.

Preferably, the current-voltage conversion circuit further comprises: a first resistor, a second resistor, a third resistor and a fourth resistor. The first resistor is connected between the first terminal of the first transistor and the input terminal, the second resistor is connected between the first terminal of the second transistor and the input terminal, the third resistor is connected to the second terminal of the first transistor, the fourth resistor is connected to the second terminal of the second transistor.

In this case, the amplification can be satisfactorily carried out at the input stage. That is to say, the amplifying amount can be determined by the ratio of the first resistor and the third resistor, and the ratio of the second resistor and the fourth resistor. As a result, the linearity of the amplification can be improved.

Preferably, the current-voltage conversion circuit further comprises: a third transistor whose control terminal is connected to the second terminal of the first transistor and whose second terminal is connected to an output terminal of the current-voltage conversion circuit, a fourth transistor whose control terminal is connected to the second terminal of the second transistor and whose second terminal is connected to the output terminal of the current-voltage conversion circuit, a fifth resistor having one end connected to the second terminal of the third transistor and other end to be grounded, and a sixth resistor having one end connected to the second terminal of the fourth transistor and other end to be grounded.

In this case, contributions of impedance of the second terminal internal resistor and the feedback circuit can be reduced at the second terminal resistors of the third transistor and the fourth transistor. Therefore, a fluctuation in a gain according to the configuration of the feedback circuit can be further repressed.

DETAILED DESCRIPTION OF THE PREFERRED EMBODIMENTS

Embodiments of the present invention will be described below with reference to the drawings.

First Embodiment

Figure 1:
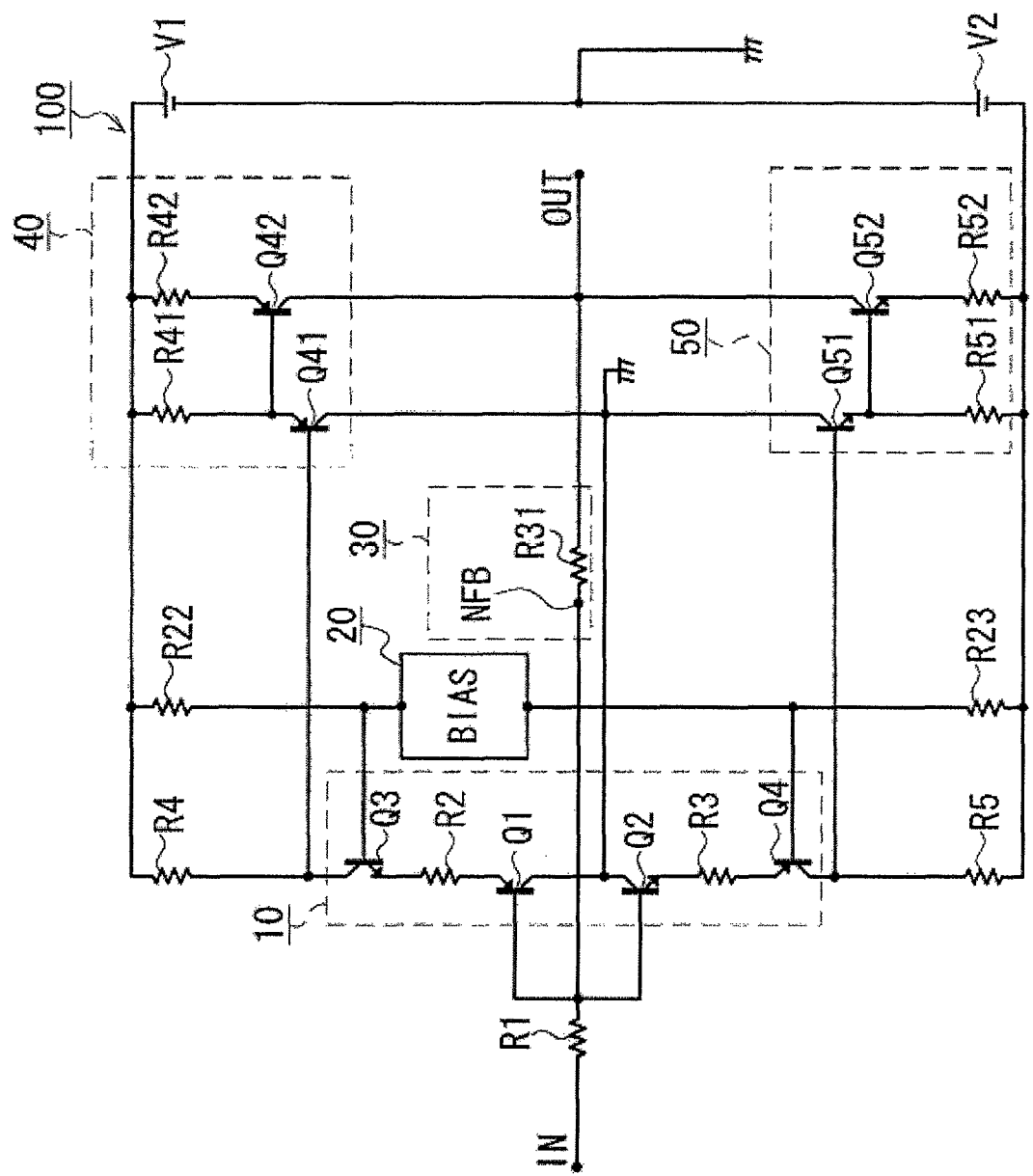
FIG. 1 is a typical circuit diagram illustrating one example of an amplifying circuit.

FIG. 1 is a typical circuit diagram illustrating one example of an amplifying circuit according to the first embodiment. An amplifying circuit 100 shown in FIG. 1 is an inverting circuit.

As shown in FIG. 1, the amplifying circuit 100 includes an input terminal IN, an input stage 10, a bias circuit 20, an output resistor section 30, and output stages 40 and 50.

Input Stage 10

The input stage 10 includes a PNP transistor Q1, an NPN transistor Q2, an NPN transistor Q3, a PNP transistor Q4 and emitter resistors R2 and R3.

As shown in FIG. 1, a base of the PNP transistor Q1 and a base of the NPN transistor Q2 are connected to the input terminal IN via an input resistor R1. A collector of the PNP transistor Q1 and a collector of the NPN transistor Q2 are connected and grounded (GND).

An emitter of the NPN transistor Q3 is connected to an emitter of the PNP transistor Q1 via the emitter resistor R2.

An emitter of the PNP transistor Q4 is connected to an emitter of the NPN transistor Q2 via an emitter resistor R3.

A collector of the NPN transistor Q3 is connected to a line of a constant power source V1 via a resistor R4, and a collector of the PNP transistor Q4 is connected to a line of a constant power source V2 via a resistor R5.

Bias Circuit 20

The bias circuit 20 is connected between a base of the NPN transistor Q3 and a base of the PNP transistor Q4. The bias circuit 20 is connected to the line of the constant power source V1 via a resistor R22, and is connected to the line of the constant power source V2 via a resistor R23. An internal configuration of the bias circuit 20 will be described later.

Output Resistor Section 30

As shown in FIG. 1, the output resistor section 30 includes an output resistor (negative feedback resistor) R31. The output resistor section 30 is inserted between base terminals of the PNP transistor Q1 and the NPN transistor Q2 and an output terminal OUT so as to form NFB (negative feedback).

Output Stage 40

The output stage 40 includes a PNP transistor Q41, a PNP transistor Q42, an emitter resistor R41 and an emitter resistor R42.

A base of the PNP transistor Q42 is connected to an emitter of the PNP transistor Q41. Concretely, the PNP transistor Q41 and the PNP transistor Q42 are Darlington-connected. A collector of the PNP transistor Q42 is connected to the output terminal OUT.

A base of the PNP transistor Q41 is connected to a collector of the NPN transistor Q3 at the input stage, and a collector of the PNP transistor Q41 is grounded (GND).

An emitter of the PNP transistor Q41 is connected to the line of the constant power source V1 via the emitter resistor 41, and an emitter of the PNP transistor Q42 is connected to the line of the constant power source V1 via the emitter resistor R42.

Output Stage 50

Similarly, the output stage 50 includes an NPN transistor Q51, an NPN transistor Q52, and emitter resistors R51 and R52.

A base of the NPN transistor Q52 is connected to an emitter of the NPN transistor Q51. Concretely, the NPN transistor Q51 and the NPN transistor Q52 are Darlington-connected. A collector of the NPN transistor Q52 is connected to the output terminal OUT.

A base of the NPN transistor Q51 is connected to a collector of the PNP transistor Q4 at the input stage, and a collector of the NPN transistor Q51 is grounded (GND).

An emitter of the NPN transistor Q51 is connected to the line of the constant power source V2 via the emitter resistor R51, and an emitter of the NPN transistor Q52 is connected to the line of the constant power source V2 via the emitter resistor R52.

Details of the Bias Circuit 20

Figure 2:
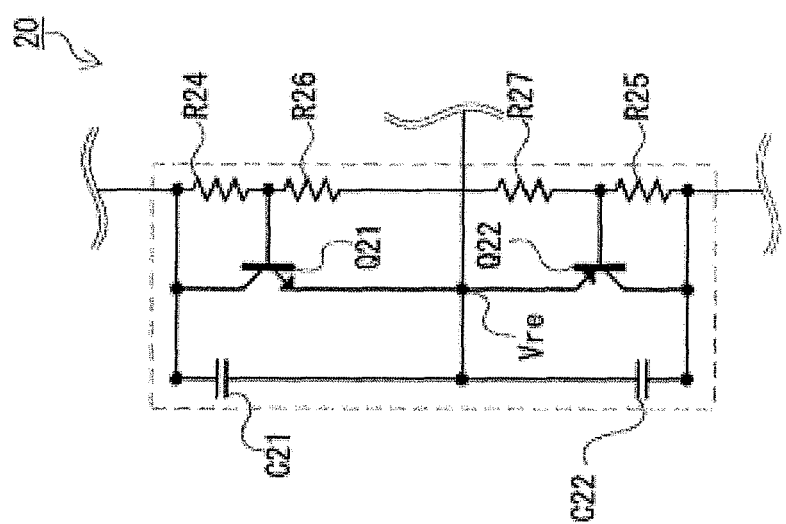
FIG. 2 is a typical circuit diagram illustrating one example of a bias circuit according to the present invention.

FIG. 2 is a typical circuit diagram for describing details of the bias circuit 20.

As shown in FIG. 2, the bias circuit 20 includes a capacitor C21, a capacitor C22, an NPN transistor Q21, a PNP transistor Q22, a resistor R24, a resistor R25, a resistor R26 and a resistor R27.

An emitter of the NPN transistor Q21 is connected to a reference terminal Vre (ground potential GND). The capacitor C21 is provided between an emitter and a collector of the NPN transistor Q21, and the resistor R24 is provided between the collector and a base.

An emitter of the PNP transistor Q22 is connected to the reference terminal Vre (the ground potential GND). The capacitor C22 is provided between an emitter and a collector of the PNP transistor Q22, and the resistor R25 is provided between the collector and a base.

The resistors R26 and R27 are connected in series between the bases of the NPN transistor Q21 and the PNP transistor Q22.

Figure 3:
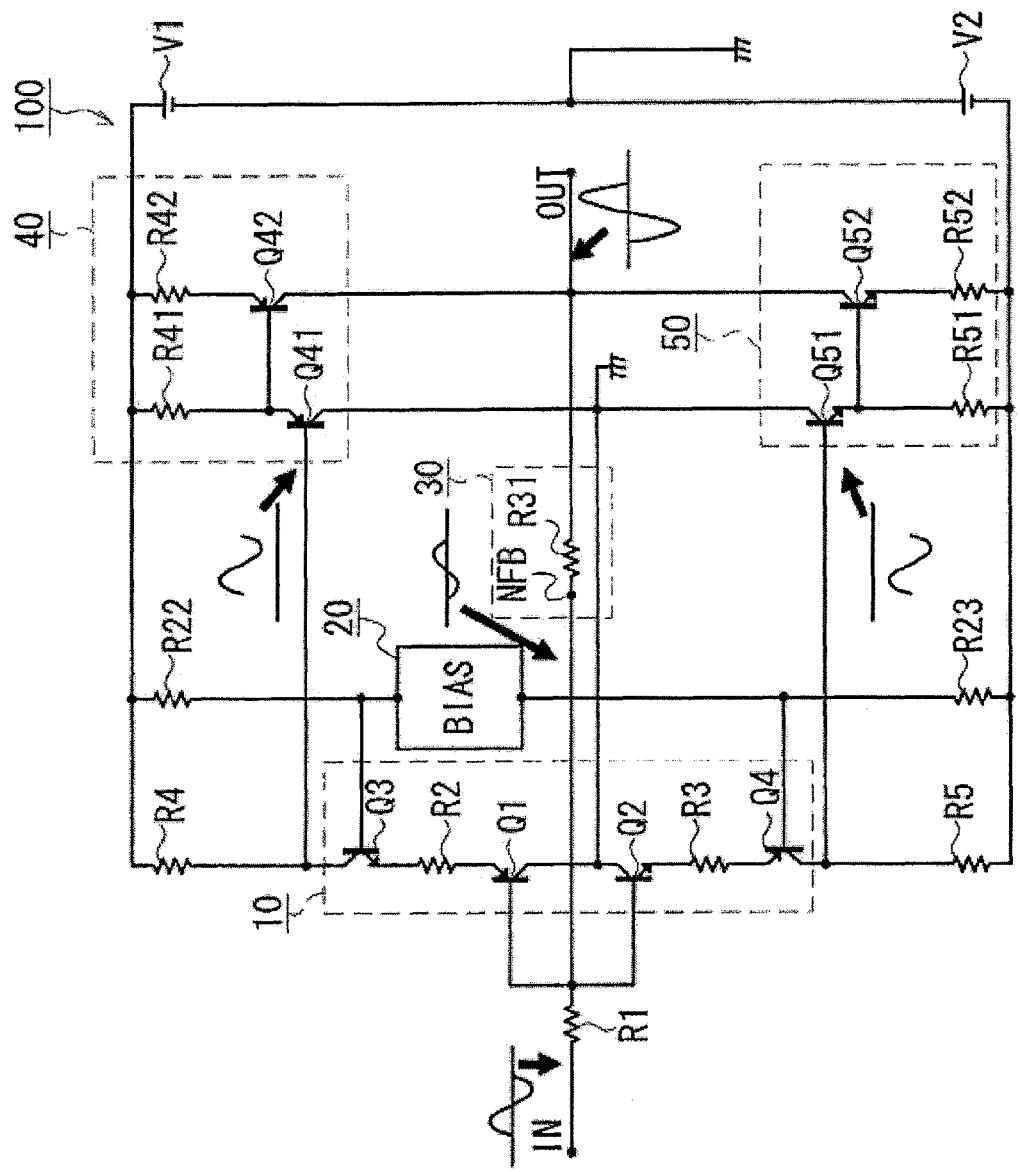
FIG. 3 is a typical explanatory diagram for describing an operation of the amplifying circuit shown in FIG. 1.
Figure 4:
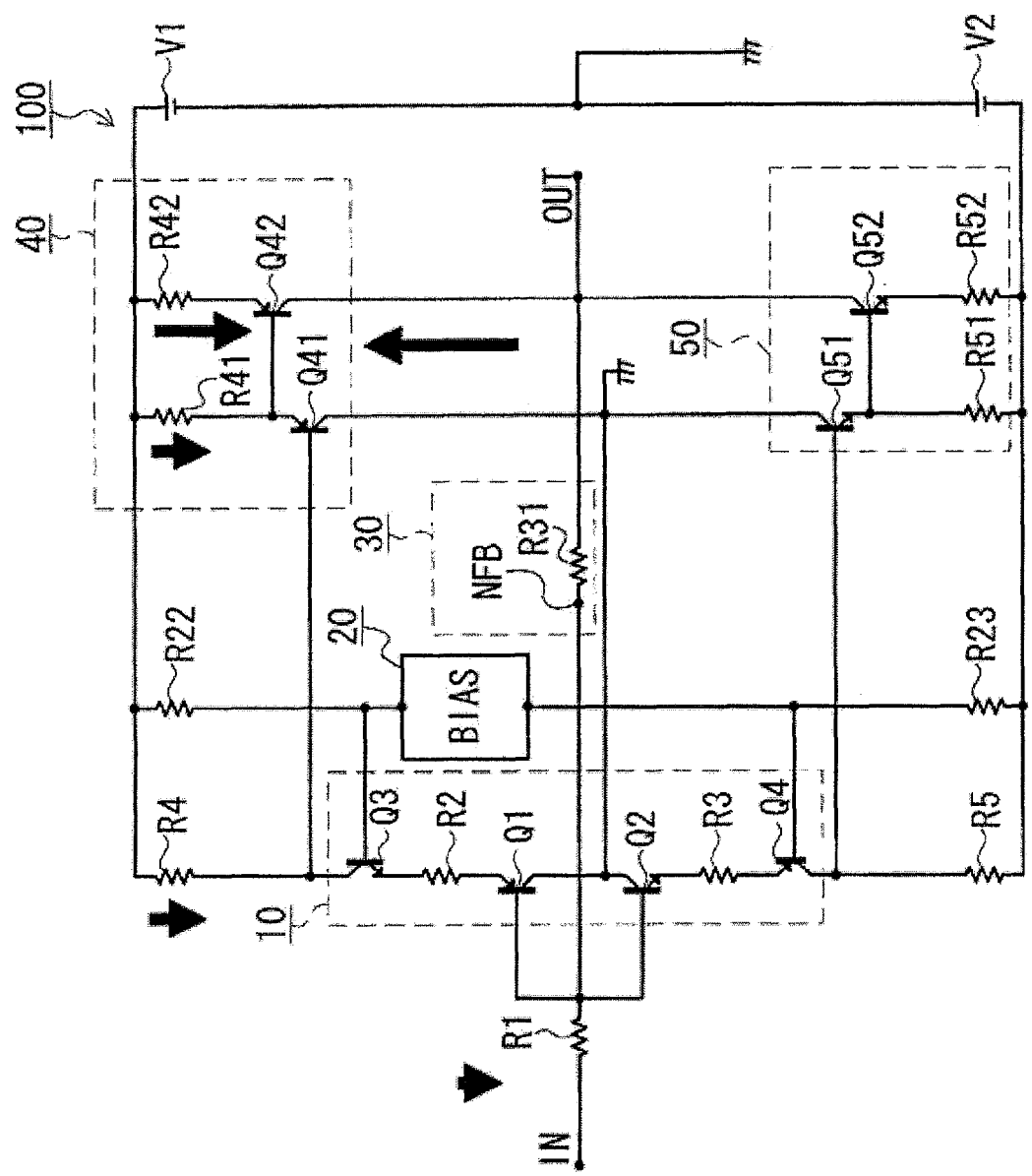
FIG. 4 is a typical explanatory diagram for describing an operation of the amplifying circuit shown in FIG. 1.

FIG. 3 and FIG. 4 are typical explanatory diagrams for describing an operation of the amplifying circuit 100 shown in FIG. 1 and FIG. 2.

In the amplifying circuit 100 shown in FIG. 3, when a signal is not input into the input terminal IN, any bias current is applied from the bias circuit 20 to the emitter resistor R2. As a result, an electric current flowing in the resistor R4 is determined. Therefore, an electric potential is generated in the resistor R4, and electric currents flowing in the emitter resistor 41 and the emitter resistor R42 are determined.

Similarly, since the amplifying circuit 100 has a symmetrical configuration in an up-down direction, the emitter resistor R3 and the resistor R5 are put into the same state.

On the other hand, when a current signal of a SIN waveform is input into the input terminal IN of the amplifying circuit 100 shown in FIG. 3, the current signal of the SIN waveform that is shifted positively is allowed to flow in the PNP transistor Q41 by amplification of the NPN transistor Q3.

A current signal of an SIN waveform that is negatively shifted is allowed to flow in the NPN transistor Q51 by amplification of the PNP transistor Q4. As a result, the amplified current signal of the SIN waveform flows in the output terminal OUT.

The current signal whose phase is opposite to that of the SIN waveform input into the input terminal IN is negatively fed back via the output resistor (negative feedback resistor) R31 (negative feedback).

As a result, the current signal of the SIN waveform that is stably amplified is output from the PNP transistor Q42 and the NPN transistor Q52 via the output terminal OUT.

Next, when a signal of a rectangular wave is input into the input terminal IN of the amplifying circuit 100 shown in FIG. 4, a voltage width of the emitter resistor R2 is increased, and an electric current flowing in the emitter resistor R2 increases according to the input rectangular wave.

The electric current flowing in the emitter resistor R2 is added to the resistor R4, and a voltage width of the resistor R4 is increased. A voltage to be applied to the emitter resistor R42 has a value obtained by subtracting a voltage (Vbe) between the base and the emitter of the PNP transistor Q41 and the PNP transistor Q42 from the voltage to be applied to the resistor R4.

It is assumed that an electric current of 1 mA flows in the resistor R4 and an electric current of 10 mA flows in the emitter resistor R42. When the voltage width of the resistor R4 is 1.5 V under this condition, a voltage width of the emitter resistor R42 becomes 0.3 V according to 1.5 V−(Vbe(Q42)+Vbe(Q41)). Further, under this condition, the resistor R4 is 1.5 KΩ, and the resistor R42 is 30 Ω.

When the input signal in the above state is increased by 10 mA, the voltage width of the resistor R4 is 15 V, and the voltage width of the emitter resistor R42 changes to 13.8 V. As a result, the voltage width of the resistor R42 changes from 0.3 V to 13.8 V, and an output current of 460 mA can be obtained from the input signal of the input current of 10 mA.

Particularly, the rectangular wave has instant leading edge and trailing edge. Further, drive of a capacitor load to be connected to the output terminal OUT depends on a current value of the output. For this reason, despite that the electric current in the PNP transistor Q42 at the stationary time is low (in the above case of 10 mA), an output signal (460 mA) can be obtained instantaneously, thereby achieving a satisfactory slew rate.

In the amplifying circuit 100, the bias circuit 20 is put into a floating state at lines of constant power sources V1 and V2, so that the voltage between the bases of the NPN transistor Q3 and the PNP transistor Q4 can be fixed by the bias circuit 20. Further, the bias circuit 20 eliminates necessity that a lot of constant current circuits are provided, thereby simplifying the circuit. Further, an influence of ripple from the lines of the constant power sources V1 and V2 can be reduced.

As described above, in the amplifying circuit 100 according to this embodiment, since the electric current at the stationary time can be repressed, unnecessary heat generation can be repressed. As a result, temperature stability of the amplifying circuit 100 can be improved. Further, the NPN transistor Q21 and the PNP transistor Q22 are thermally bonded to the transistors Q1 to Q4, so that an influence of a characteristic change due to the heats of the respective transistors can be cancelled, thereby stabilizing the output voltage. When the respective transistors of the output stages 40 and 50 are thermally bonded to the NPN transistor Q21 and the PNP transistor Q22, the output voltage can be further stabilized.

Since a base feedback system where NFB (negative feedback) is connected to the input signal is adopted, a physical shift does not occur at a difference synthesizing point, and thus accurate negative feedback can be realized.

Drive currents of the transistors Q3 and Q4 are supplied from the bias circuit 20 (particularly, the capacitors C21 and C22) without depending on the constant power sources V1 and V2. As a result, the drive currents can be instantaneously supplied to the transistors Q3 and Q4. If the drive currents are supplied from the constant power sources V1 and V2 to the transistors Q3 and Q4, high electric current should always flow in the resistors R22 and R23. For this reason, power consumption increases, but this example can solve such a problem.

In the amplifying circuit 100, the input resistor R1 can be provided with both functions of an amplifier gain and an input filter. The output resistor (negative feedback resistor) R31 can reduce noise and distortion, and can be provided with both functions of an amplifier gain and an output resistor. As a result, the circuit configuration can be simplified.

At the output stages 40 and 50, the emitter resistor R42, the emitter resistor R52 and the output resistor (negative feedback resistor) R31 can easily adjust the amplifier gain.

In the amplifying circuit 100 shown in FIG. 1, the number of stages is small and the number of poles can be repressed. For this reason, a defect of frequency characteristics and oscillation can be prevented.

In the input stage 10, a gain of the NPN transistor Q3 can be adjusted by the emitter resistor R2 and the resistor R4. Further, a gain of the PNP transistor Q4 can be adjusted by the emitter resistor R3 and the resistor R5.

In the amplifying circuit 100 according to the first embodiment, the NPN transistor Q3 and the PNP transistor Q4 can be regarded as base grounds. As a result, a wide band of the amplifying circuit 100 can be realized.

In a conventional current feedback circuit, a stage having a plurality of constant current sources is provided, and it is difficult to adjust a bias current and a DC offset. However, in the amplifying circuit 100 according to the first embodiment, the resistors R24 and R25, and the resistors R26 and R27 are adjusted so that the DC offset can be adjusted by the resistors R24 and R25, and the bias current can be adjusted by the resistors R26 and R27.

The first embodiment is not limited to the above circuit configuration. For example, a collector of the transistor Q1 and a collector of the transistor Q2 may be connected to different potentials. That is to say, the collector of the transistor Q1 may be connected to the constant power source V2, and the collector of the transistor Q2 may be connected to the constant power source V1. In another manner, the collector of the transistor Q1 may be connected between the bias circuit 20 and the resistor R22, and the collector of the transistor Q2 may be connected between the bias circuit 20 and the resistor R23. Further, the collector of the transistor Q41 and the collector of the transistor Q42 may be connected to different potentials. In another manner, the collector of the transistor Q41 may be connected to the collector of the transistor Q42, and the collector of the transistor Q51 may be connected to the collector of the transistor Q52.

Second Embodiment

Figure 5:
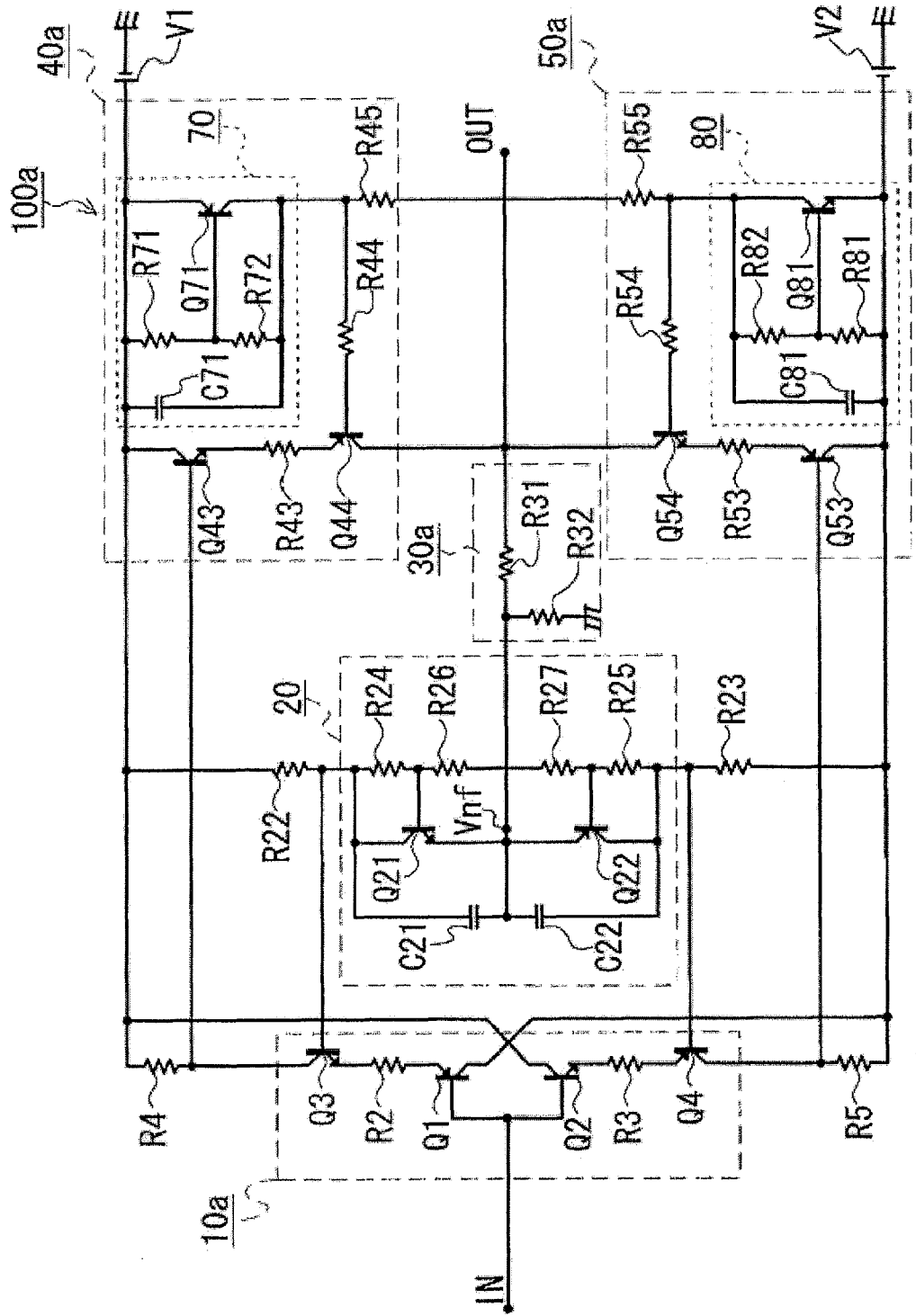
FIG. 5 is a typical circuit diagram illustrating another example of the amplifying circuit shown in FIG. 1.

FIG. 5 is a typical circuit diagram illustrating one example of the amplifying circuit according to a second embodiment. An amplifying circuit 100a shown in FIG. 5 is one example of a non-inverting circuit. The second embodiment will describe mainly a point different from the amplifying circuit 100 according to the first embodiment.

As shown in FIG. 5, the amplifying circuit 100a according to the second embodiment has an input stage 10a instead of the input stage 10 of the amplifying circuit 100. An output resistor section 30a is provided instead of the output resistor section 30. Further, an output stage 40a is provided instead of the output stage 40, and an output stage 50a is provided instead of the output stage 50.

A circuit equivalent to the bias circuit in FIG. 2 is used as the bias circuit 20, and it is an adjusting stage of a bias current and an output DC voltage and produces the equivalent effect.

The reference terminal of the bias circuit 20 is connected to a path of the negative feedback, and functions as a voltage feedback terminal Vnf.

Input Stage 10a

The input stage 10a includes the PNP transistor Q1, the NPN transistor Q2, the NPN transistor Q3, the PNP transistor Q4 and the emitter resistors R2 and R3.

As shown in FIG. 5, the base of the PNP transistor Q1 and the base of the NPN transistor Q2 are connected to the input terminal IN.

The collector of the PNP transistor Q1 is connected to the line of the constant power source V2. The collector of the NPN transistor Q2 is connected to the line of the constant power source V1. The emitter of the NPN transistor Q3 is connected to the emitter of the PNP transistor Q1 via the emitter resistor R2. The emitter of the PNP transistor Q4 is connected to the emitter of the NPN transistor Q2 via the emitter resistor R3.

The bias circuit 20 is provided between the base of the NPN transistor Q3 and the base of the PNP transistor Q4, and the collector of the NPN transistor Q3 is connected to the line of the constant power source V1 via the resistor R4. The collector of the PNP transistor Q4 is connected to the line of the constant power source V2 via the resistor R5.

Output Resistor Section 30a

As shown in FIG. 5, an output resistor section 30a includes the output resistor (negative feedback resistor) R31 and a resistor R32. The resistor R32 is provided to a side closer to the input stage 10a than the resistor R31, and its one end is grounded (GND).

Output Stage 40a

The output stage 40a includes an NPN transistor Q43, a PNP transistor Q44, an emitter resistor R43, a resistor R44, a resistor R45, and a bias circuit 70.

An emitter of the NPN transistor Q43 is connected to an emitter of the PNP transistor Q44 via the emitter resistor R43. Concretely, the NPN transistor Q43 and the PNP transistor Q44 are Darlington-connected. A collector of the PNP transistor Q44 is connected to the output terminal OUT.

A base of the NPN transistor Q43 is connected to the collector of the NPN transistor Q3 at the input stage, and a collector of the NPN transistor Q43 is connected to the line of the constant power source V1.

A base of the PNP transistor Q44 is connected to a collector of a PNP transistor Q71, described later, via the resistor R44. As a result, the resistor 44 as well as a capacity between the collector and the base of the PNP transistor Q44 forms a low-pass filter. Further, the resistor R45 is inserted between the collector of the PNP transistor Q71 and a collector of a transistor Q81 of a bias circuit 80, described later, in series with respect to a resistor R55, described later.

Bias Circuit 70

As shown in FIG. 5, the bias circuit 70 includes a capacitor C71, the PNP transistor Q71, and resistors R71 and R72.

An emitter of the PNP transistor Q71 is connected to the line of the constant power source V1. A base of the PNP transistor Q71 is connected to the line of the constant power source V1 via the resistor R71. Further, a resistor R72 is inserted between the base and the collector of the PNP transistor Q71.

The capacitor C71 is inserted between the collector of the PNP transistor Q71 and the line of the constant power source V1.

Output Stage 50a

The output stage 50a includes a PNP transistor Q53, an NPN transistor Q54, emitter resistors R53, R54 and R55, and the bias circuit 80.

An emitter of the PNP transistor Q53 is connected to an emitter of the NPN transistor Q54 via the emitter resistor R53. Concretely, the PNP transistor Q53 and the NPN transistor Q54 are Darlington-connected. A collector of the NPN transistor Q54 is connected to the output terminal OUT.

A base of the PNP transistor Q53 is connected to the collector of the PNP transistor Q4 at the input stage, and a collector of the PNP transistor Q53 is connected to the line of the constant power source V2.

A base of the NPN transistor Q54 is connected to the collector of the NPN transistor Q81, described later, via the emitter resistor R54. As a result, the resistor R54 as well as a capacity between the collector and the base of the NPN transistor Q54 form a low-pass filter.

Bias Circuit 80

As shown in FIG. 5, the bias circuit 80 includes a capacitor C81, the NPN transistor Q81, and resistors R81 and R82.

An emitter of the NPN transistor Q81 is connected to the line of the constant power source V2. A base of the NPN transistor Q81 is connected to the line of the constant power source V2 via the resistor R81. Further, the resistor R82 is inserted between the base and the collector of the NPN transistor Q81.

The capacitor C81 is inserted between the collector of the NPN transistor Q81 and the line of the constant power source V2.

The amplifying circuit 100a according to the second embodiment is one example of the non-inverting circuit composed of a symmetrical circuit. In the amplifying circuit 100a, the later stage amplifying is performed by the PNP transistor Q44, the NPN transistor Q54, the emitter resistor R43, the emitter resistor R53, and the output resistor (negative feedback resistor) R31.

A bias current can be adjusted by using the bias circuit 20 at the input stage 10a, and independently from this adjustment, the bias current can be adjusted by using the output stages 40a and 50a. As a result, a degree of circuit design freedom can be widened. Further, the output resistors (negative feedback resistors) R31 and R32 can determine a total gain of the amplifying circuit 100a.

In the amplifying circuit 100a, the transistors Q1 and Q3 and the resistor R2 of the input stage 10a have the same circuit configuration as that of the transistors Q43 and Q44 and the resistor R43 at the output stage 40a. The transistors Q2 and Q4 and the resistor R3 of the input stage 10a have the same circuit configuration as that of the transistors Q53 and Q54 and the resistor R53 at the output stage 50a.

Therefore, the output signal and the input signal establish a non-inverting relationship. The non-inverted output signal is supplied to the bases of the transistors Q3 and Q4 (via the bias circuit 20), so that the negative feedback can be realized.

More specifically, a negative feedback path is connected to the voltage feedback terminal Vnf (the reference terminal) of the bias circuit 20. Therefore, as a negative feedback path, a negative feedback path to the transistor Q3 and a negative feedback path to the transistor Q4 do not have to be separately provided. That is to say, since a supply path of the drive currents from the bias circuit 20 to the transistors Q3 and Q4 can be used also as the negative feedback path to the transistors Q3 and Q4, the circuit configuration can be simplified.

Third Embodiment

Figure 6:
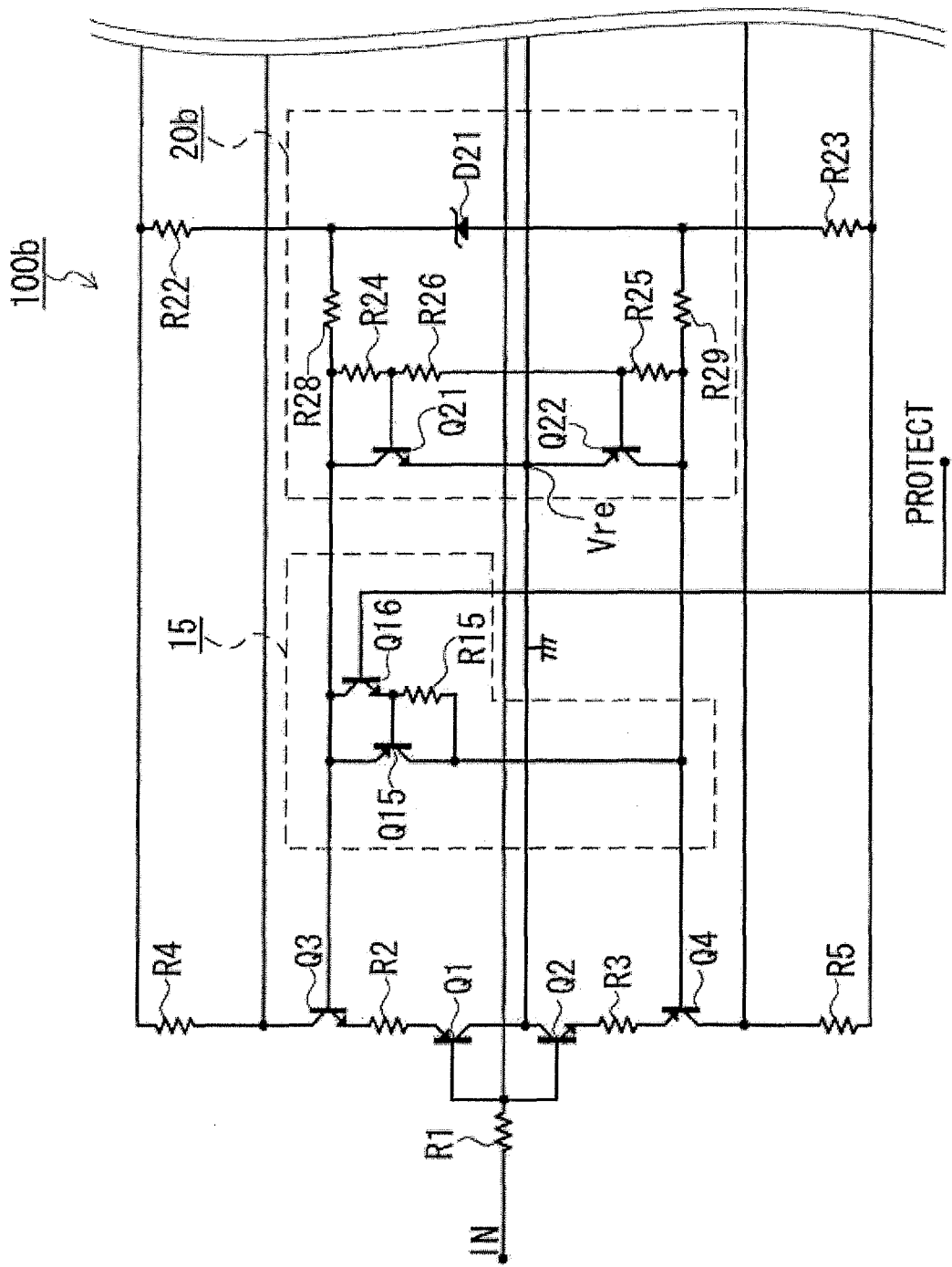
FIG. 6 is a typical circuit diagram illustrating one example of the amplifying circuit.

FIG. 6 is a typical circuit diagram illustrating one example of the amplifying circuit according to a third embodiment. A different point between the amplifying circuit 100b according to the third embodiment and the amplifying circuit 100 according to the first embodiment will be described below.

As shown in FIG. 6, the amplifying circuit 100b further has a short-circuit protection circuit 15 additionally to the amplifying circuit 100, and a bias circuit 20b instead of the bias circuit 20.

Short-Circuit Protection Circuit 15

As shown in FIG. 6, the short-circuit protection circuit 15 includes a PNP transistor Q15, an NPN transistor Q16, a resistor R15, and a short-circuit protection input terminal PROTECT.

An emitter of the PNP transistor Q15 is connected between the base of the NPN transistor Q3 and the bias circuit 20b. A collector of the PNP transistor Q15 is connected between the base of the PNP transistor Q4 and the bias circuit 20b. A base of the PNP transistor Q15 is connected to an emitter of NPN transistor Q16.

A collector of the NPN transistor Q16 is connected between the base of the NPN transistor Q3 and the bias circuit 20b. An emitter of the NPN transistor Q16 is connected to the collector of the PNP transistor Q15 via the resistor R15. A base of the NPN transistor Q16 is connected to the short-circuit protection input terminal PROTECT.

Bias Circuit 20b

As shown in FIG. 6, the bias circuit 20b includes the NPN transistor Q21, the PNP transistor Q22, the resistor R24, the resistor R25, the resistor R26, a resistor 28, a resistor 29 and a zener diode D21.

The reference terminal Vre is provided between an emitter of the NPN transistor Q21 and an emitter of the PNP transistor Q22. An emitter of the NPN transistor Q21 is connected to the reference terminal Vre. The resistor R24 is provided between a collector and a base of the NPN transistor Q21.

An emitter of the PNP transistor Q22 is connected to the reference terminal Vre. The resistor R25 is provided between a collector and a base of the PNP transistor Q22.

The resistor R26 is provided between the NPN transistor Q21 and the PNP transistor Q22.

A cathode of the zener diode D21 is connected to the collector of the NPN transistor Q21 via a resistor R28, and an anode of the zener diode D21 is connected to the collector of the PNP transistor Q22 via a resistor R29.

As described above, in the amplifying circuit 100b according to the third embodiment, the voltage can be made to be constant by the zener diode D21. When the zener diode D21 is used, an influence of a great fluctuation in a supply voltage is not exerted. Further, the short-circuit protection circuit 15 can protect the circuit at abnormality detecting time.

The short-circuit protection circuit 15 will be described below. Any voltage is applied to the short-circuit protection input terminal PROTECT at the normal time. In this case, the NPN transistor Q16 is in an ON state, and the PNP transistor Q15 is in an OFF state.

On the other hand, the short-circuit protection input terminal PROTECT is grounded (GND) at the abnormal time. In this case, the NPN transistor Q16 is in the OFF state and the PNP transistor Q15 is in the ON state, and the base of the NPN transistor Q3 and the base of the PNP transistor Q4 are short-circuited. As a result, the amplification of the amplifying circuit 100b is instantaneously stopped. The amplifying circuit in FIG. 5 can be provided with the short-circuit protection circuit 15.

Figure 7:
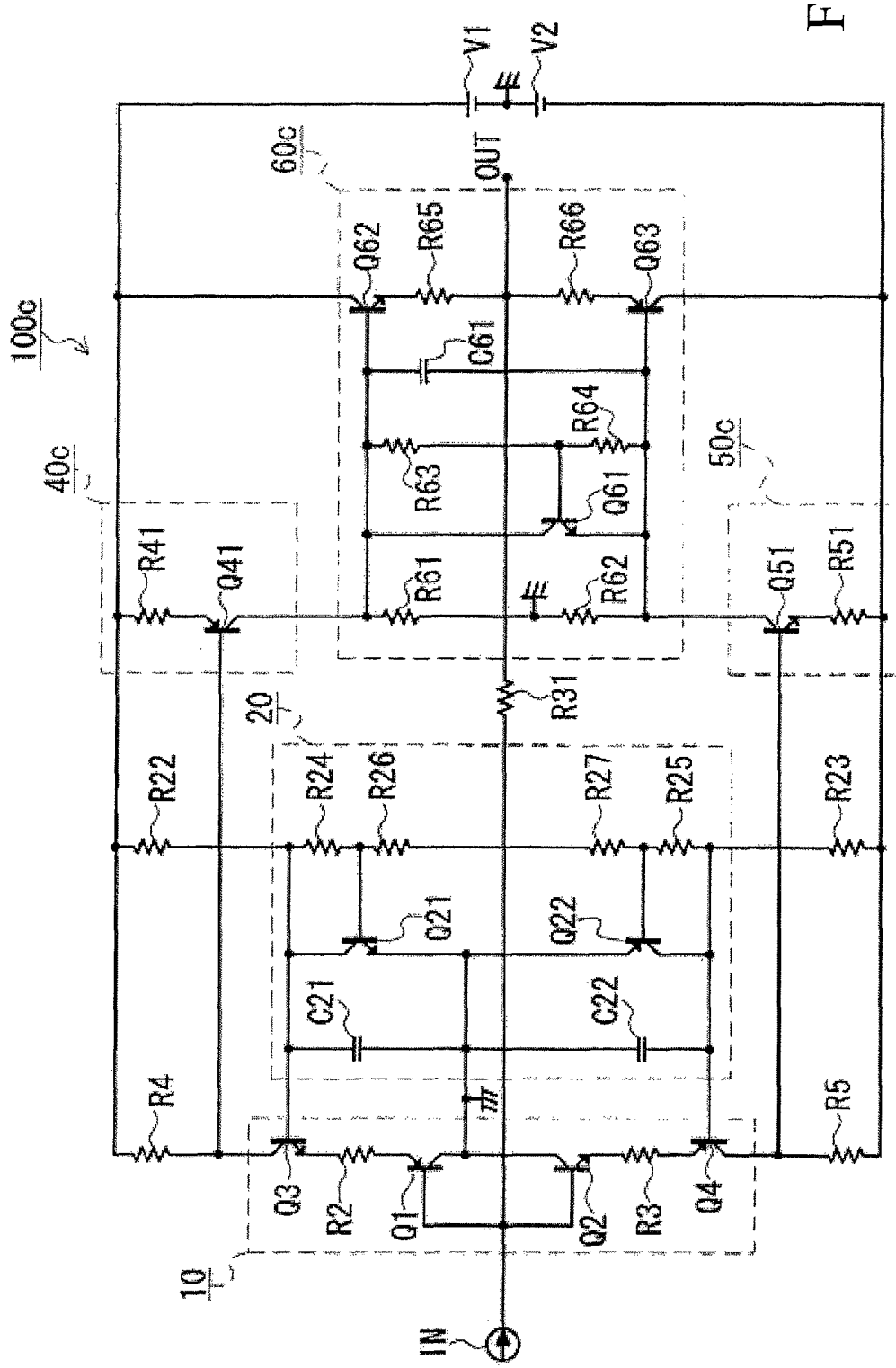
FIG. 7 is a typical circuit diagram where the amplifying circuit is applied to a current-voltage conversion circuit.

FIG. 7 is a typical circuit diagram where the amplifying circuit according to the first embodiment is applied to a current-voltage conversion circuit. In FIG. 7, an inverting amplification circuit is laid out on the current-voltage conversion circuit.

As shown in FIG. 7, the amplifying circuit 100 is altered into a current-voltage conversion circuit 100c. The current-voltage conversion circuit 100c shown in FIG. 7 includes an output stage 40c, an output stage 50c, and an output stage 60c.

In the output stages 40c and 50c, the Darlington connection is eliminated from the output stages 40 and 50, and the output stage 60c is a circuit for reducing an output impedance.

Fourth Embodiment

Figure 8:
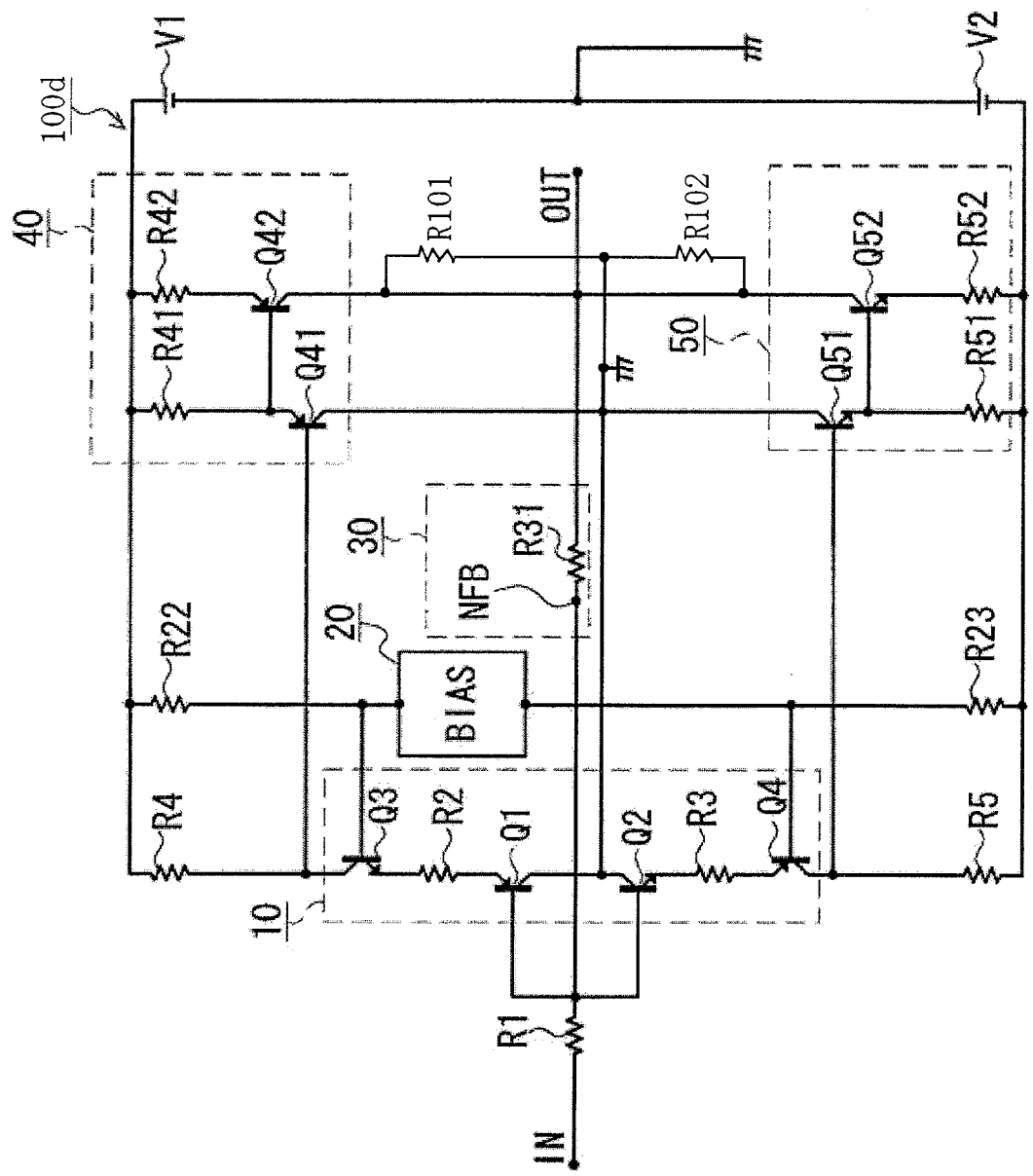
FIG. 8 is a typical circuit diagram illustrating one example of the amplifying circuit.

FIG. 8 is a typical circuit diagram illustrating one example of the amplifying circuit according to a fourth embodiment. A different point between the amplifying circuit 100d according to the fourth embodiment and the amplifying circuit 100 according to the first embodiment will be described below.

As shown in FIG. 8, the amplifying circuit 100d further includes resistors R101 and R102. One end of the resistor R101 is connected to the collector of the transistor Q42, and the other end is grounded. One end of the resistor R102 is connected to the collector of the transistor Q52, and the other end is grounded. The collectors of the transistors Q42 and Q52 are grounded via the resistors R101 and R102, thereby preventing gains of the output stages 40 and 50 from fluctuating due to the resistor R31 of the output resistor section 30. The resistor R101 will be described as an example, but the same is true for the resistor R102.

The resistor R42 is an emitter resistor of the transistor Q42. A collector resistor of the transistor Q42 is represented by a resistor obtained by synthesizing the resistor R101, a collector internal resistor of the transistor Q42 and the resistor R31. When an output admittance of the transistor Q42 is represented by hoe, the collector internal resistor is expressed by (1/hoe). When a resistance value of the resistor R101 is very smaller than the collector internal resistor of the transistor Q42 and the resistor R31, contribution of the resistor R101 is dominant in the collector resistor and contribution of the resistor R31 reduces.

When the resistor R101 is not connected, the resistor R31 is lower than the collector internal resistor and the resistor R31 is dominant in the collector resistor of the transistor Q42. That is to say, the gain of the amplifying circuit fluctuates due to the resistance value of the resistor R31. However, when the resistor R101 is provided, an influence of the resistor R31 to be exerted on the gain of the amplifying circuit can be repressed.

In the above embodiments shown in FIG. 1 to FIG. 8, a compensating circuit is not provided, but not limited to this, and any circuit such as a phase compensating circuit may be provided to the output resistor (negative feedback resistor) R31.

Fifth Embodiment

Figure 9:
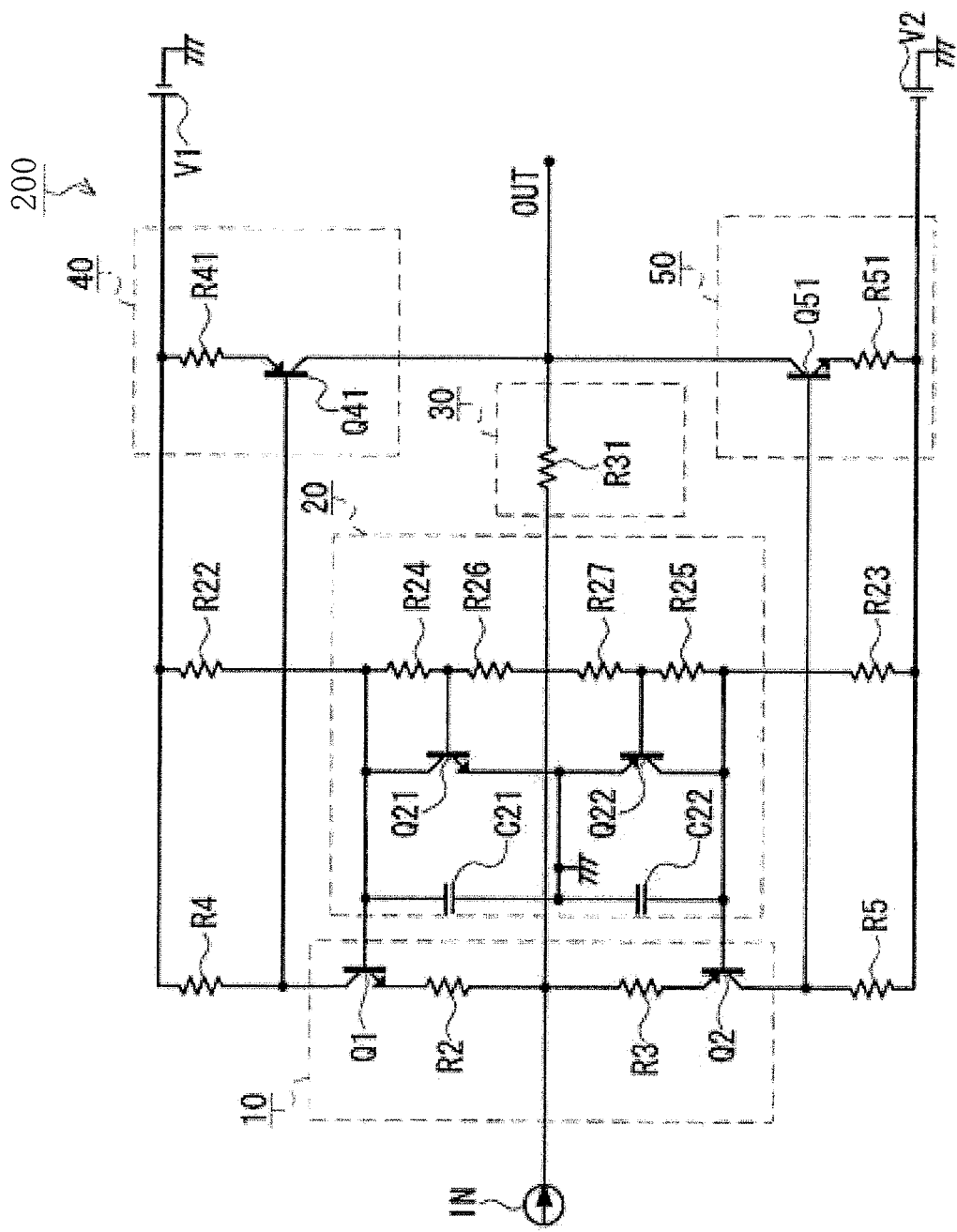
FIG. 9 is a typical circuit diagram illustrating one example of the current-voltage conversion circuit.

FIG. 9 is a typical circuit diagram illustrating one example of a current-voltage conversion circuit according to a fifth embodiment. The current-voltage conversion circuit 200 includes the input terminal IN, the input stage 10, the bias circuit 20, the output resistor section 30 and the output stages 40 and 50.

Input Stage 10

The input stage 10 includes an NPN transistor Q1, a PNP transistor Q2, and the emitter resistors R2 and R3.

As shown in FIG. 9, an emitter of the NPN transistor Q1 is connected to the input terminal IN via the resistor R2. An emitter of the PNP transistor Q2 is connected to the input terminal IN via the resistor R3.

The bias circuit 20 is inserted between a base of the NPN transistor Q1 and a base of the PNP transistor Q2.

A collector of the NPN transistor Q1 is connected to the line of the constant power source V1 via the resistor R4, and a collector of the PNP transistor Q2 is connected to the line of the constant power source V2 via the resistor R5.

Bias Circuit 20

The bias circuit 20 includes the capacitors C21 and C22, the NPN transistor Q21, the PNP transistor Q22, and the resistors R24, R25, R26 and R27.

An emitter of the NPN transistor Q21 is grounded (GND). The capacitor C21 is provided between the emitter and the collector of the NPN transistor Q21, and the resistor R24 is provided between the base and the collector.

The emitter of the PNP transistor Q22 is grounded (GND). The capacitor C22 is provided between the emitter and the collector of the PNP transistor Q22, and the resistor R25 is provide between the collector and the base.

The resistors R26 and R27 are connected between the bases of the NPN transistor Q21 and the PNP transistor Q22 in series.

The bias circuit 20 is connected to the line of the constant power source V1 via the resistor R22, and to the line of the constant power source V2 via the resistor R23.

Output Resistor Section 30

As shown in FIG. 9, the output resistor section 30 has the output resistor R31. The output resistor R31 is inserted between the emitter of the NPN transistor Q1 at the input stage 10 and the emitter of the PNP transistor Q2 and the output terminal OUT. A scale of the output resistor R31 can be determined by an upper limit of an electric current to be input and a upper limit of a voltage to be output. Further, the output resistor R31 shown in FIG. 9 functions as a negative feedback resistor.

Output Stage 40

The output stage 40 includes the PNP transistor Q41 and a resistor R41.

The base of the PNP transistor Q41 is connected to the collector of the NPN transistor Q1 at the input stage. The emitter of the PNP transistor Q41 is connected to the line of the constant power source V1 via the resistor R41. The collector of the PNP transistor Q41 is connected to the output terminal OUT.

Output Stage 50

The output stage 50 includes the NPN transistor Q51 and the resistor R51.

The base of the NPN transistor Q51 is connected to the collector of the PNP transistor Q2 at the input stage. The emitter of the NPN transistor Q51 is connected to the line of the constant power source V2 via the resistor R51. The collector of the NPN transistor Q51 is connected to the output terminal OUT.

If an electric current to be input into the input terminal IN of the current-voltage conversion circuit 200 shown in FIG. 9 reduces, the voltage width of the emitter resistor R2 is widened, and an electric current flowing in the emitter resistor R2 increases according to the input electric current. The electric current flowing in the emitter resistor R2 is added to the resistor R4, and the voltage width of the resistor R4 increases. A voltage to be applied to the emitter resistor 41 is a value obtained by subtracting a value (Vbe) between the base and the emitter of the PNP transistor Q41 from the voltage to be applied to the resistor R4.

It is assumed that an electric current of 1 mA flows in the resistor R4, and an electric current of 10 mA flows in the emitter resistor R41. When the voltage width of the resistor R4 is 1.5 V under this condition, the voltage width of the emitter resistor R41 is 0.9 V according to 1.5 V−(Vbe(Q41)). Further, under that condition, the resistor R4 is 1.5 KΩ, and the resistor R41 is 90 Ω.

When the input current increases from the above state to 10 mA, the voltage width of the resistor R4 is 15 V, and the voltage width of the emitter resistor 41 changes to 14.4 V. Further, when the input current increases, the symmetrical circuit similarly operates.

As described above, in the current-voltage conversion circuit 200, the output resistor section 30 and the output stages 40 and 50 determine an amplification width at a later stage.

In the current-voltage conversion circuit 200 according to the embodiment, the electric current supplied from the input terminal IN is supplied to the NPN transistor Q1 and the PNP transistor Q2 of the input stage 10. The electric current flowing in the NPN transistor Q1 increases and decreases (in the PNP transistor Q2, a reverse operation) according to a rise and a drop of an applied voltage of the NPN transistor Q1. For this reason, the voltages applied from the line of the constant power source V1 and the line of the constant power source V2 are inversely proportional to the voltage in the bias circuit 20, and the voltage can be stably output from the output terminal.

In the current-voltage conversion circuit 200, the bias circuit 20 is put into a floating state from the lines of the constant power sources V1 and V2, and the voltage between the bases of the NPN transistor Q1 and the PNP transistor Q2 can be fixed by the bias circuit 20. Further, a lot of constant current circuits do not have to be provided due to the bias circuit 20, so that the circuit can be simplified. Further, an influence of ripple from the lines of the constant power sources V1 and V2 can be reduced. The drive currents of the transistors Q1 and Q2 are supplied from the bias circuit 20 (particularly, the capacitors C21 and C22) without depending on the constant power sources V1 and V2, so that the drive currents can be instantaneously supplied to the transistors Q1 and Q2. If the drive currents are supplied from the constant power sources V1 and V2 to the transistors Q1 and Q2, high electric currents should always flow in the resistors R22 and R23. For this reason, the power consumption increases, but such a problem can be solved in this example.

In the current-voltage conversion circuit 200 according to the embodiment, since the electric current can be repressed at the stationary time, heat generation can be repressed, thereby improving the temperature stability of the current-voltage conversion circuit 200. Further, the NPN transistor Q21 and the PNP transistor Q22 are thermally bonded to the transistors Q1 and Q2, so that an influence of a change in the characteristics caused by the heats of the respective transistors can be cancelled. As a result, the output voltage can be stabilized. The respective transistors of the output stages 40 and 50 are thermally bonded to the NPN transistor Q21 and the PNP transistor Q22, so that the output voltage can be further stabilized.

The output resistor (negative feedback resistor) R31 can reduce noise and distortion, and can be provided with both functions of the amplifier gain and the output resistor. As a result, the circuit configuration can be simplified.

At the input stage 10, the gain of the NPN transistor Q1 can be adjusted by the emitter resistor R2 and the resistor R4. Further, the gain of the PNP transistor Q2 can be adjusted by the emitter resistor R3 and the resistor R5.

In the current-voltage conversion circuit 200 according to the embodiment, the bases of the NPN transistor Q1 and the PNP transistor Q2 are grounded. As a result, the wide band of the current-voltage conversion circuit 200 can be realized.

Another Example

Figure 10:
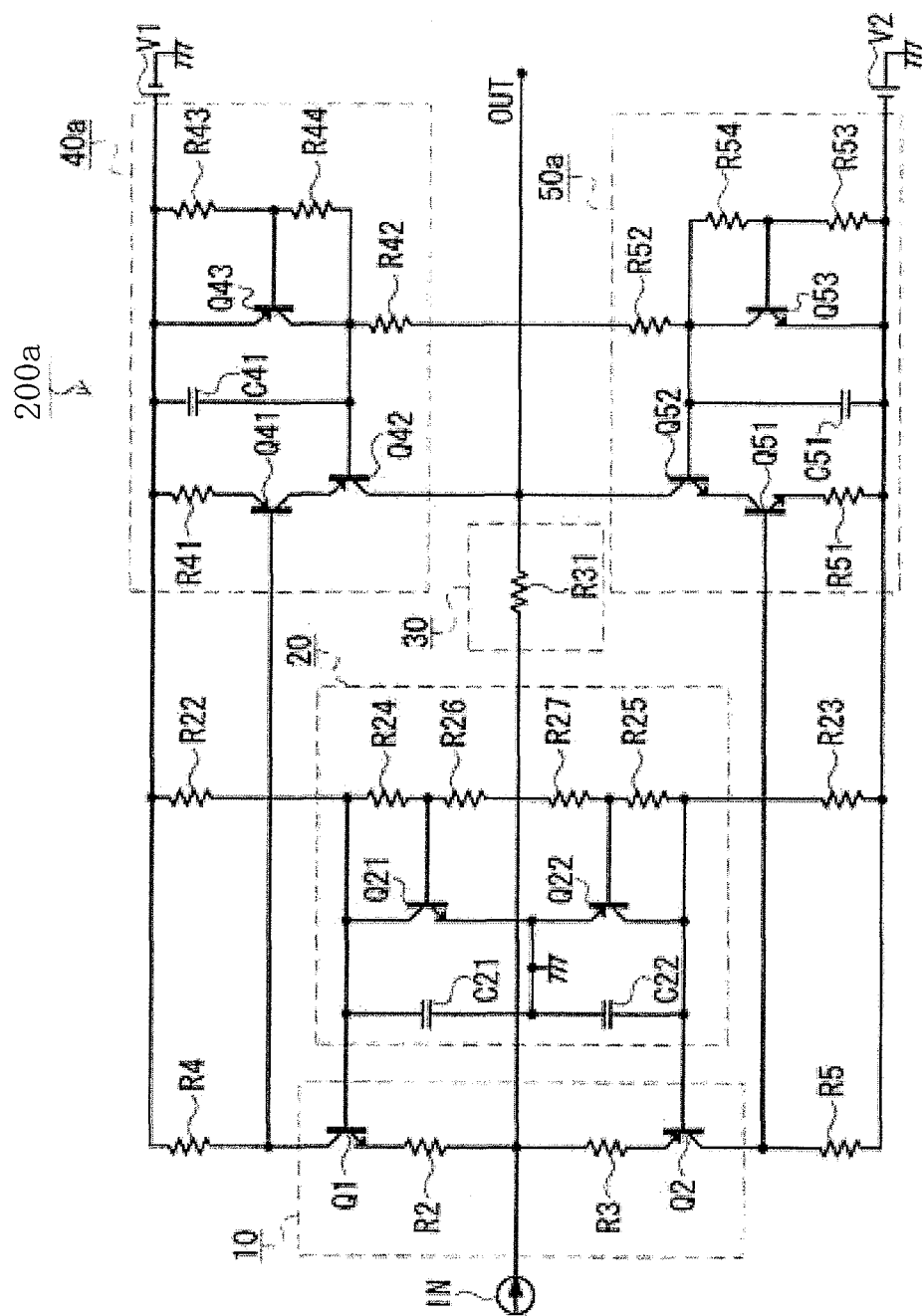
FIG. 10 is a typical circuit diagram illustrating another example of the current-voltage conversion circuit.

FIG. 10 is a typical circuit diagram illustrating another example of the current-voltage conversion circuit 200. A different point between a current-voltage conversion circuit 200a of another example and the current-voltage conversion circuit 200 according to the first embodiment will be mainly described below.

As shown in FIG. 10, the current-voltage conversion circuit 200a includes output stages 40a and 50a instead of the output stages 40 and 50 of the current-voltage conversion circuit 200. That is to say, the output stages 40a and 50a are constituted by adding a cascode circuit to the output stages 40 and 50.

Output Stage 40a

The output stage 40a includes the PNP transistors Q41, Q42 and Q43, the resistors R41, R42, R43 and R44, and a capacitor C41.

The collector of the PNP transistor Q41 is connected to the emitter of the PNP transistor Q42. The collector of the PNP transistor Q42 is connected to the output terminal OUT.

The base of the PNP transistor Q41 is connected to the collector of the NPN transistor Q1 at the input stage, and the emitter of the PNP transistor Q41 is connected to the line of the constant power source V1 via the resistor R41.

The base of the PNP transistor Q42 is connected to the collector of the PNP transistor Q43. Further, the resistor R42 is inserted between the collector of the PNP transistor Q43 and a collector of an NPN transistor Q53, described later, in series with the resistor R52, described later.

The emitter of the PNP transistor Q43 is connected to the line of the constant power source V1. The base of the PNP transistor Q43 is connected to the line of the constant power source V1 via the resistor R43. Further, the resistor R44 is inserted between the base and the collector of the PNP transistor Q43.

The capacitor C41 is inserted between the collector of the PNP transistor Q43 and the line of the constant power source V1.

Output Stage 50a

The output stage 50a includes the NPN transistors Q51, Q52 and Q53, the resistors R51, R52, R53 and R54, and a capacitor C51.

The collector of the NPN transistor Q51 is connected to the emitter of the NPN transistor Q52. The collector of the NPN transistor Q52 is connected to the output terminal OUT.

The base of the NPN transistor Q51 is connected to the collector of the PNP transistor Q2 at the input stage, and the emitter of the NPN transistor Q51 is connected to the line of the constant power source V2 via the resistor 51.

The emitter of the NPN transistor Q53 is connected to the line of the constant power source V2. The base of the NPN transistor Q53 is connected to the line of the constant power source V2 via the resistor R53. Further, the resistor R54 is inserted between the base and the collector of the NPN transistor Q53. The base of the NPN transistor Q52 is connected to the collector of the NPN transistor Q53.

The capacitor C51 is inserted between the collector of the NPN transistor Q53 and the line of the constant power source V2.

The addition of the cascade circuit can reduce power loss of the transistors Q41 and Q42. Since a mirror effect is not produced, frequency characteristics of the output stages 40a and 50a can be improved.

Still Another Example

Figure 11:
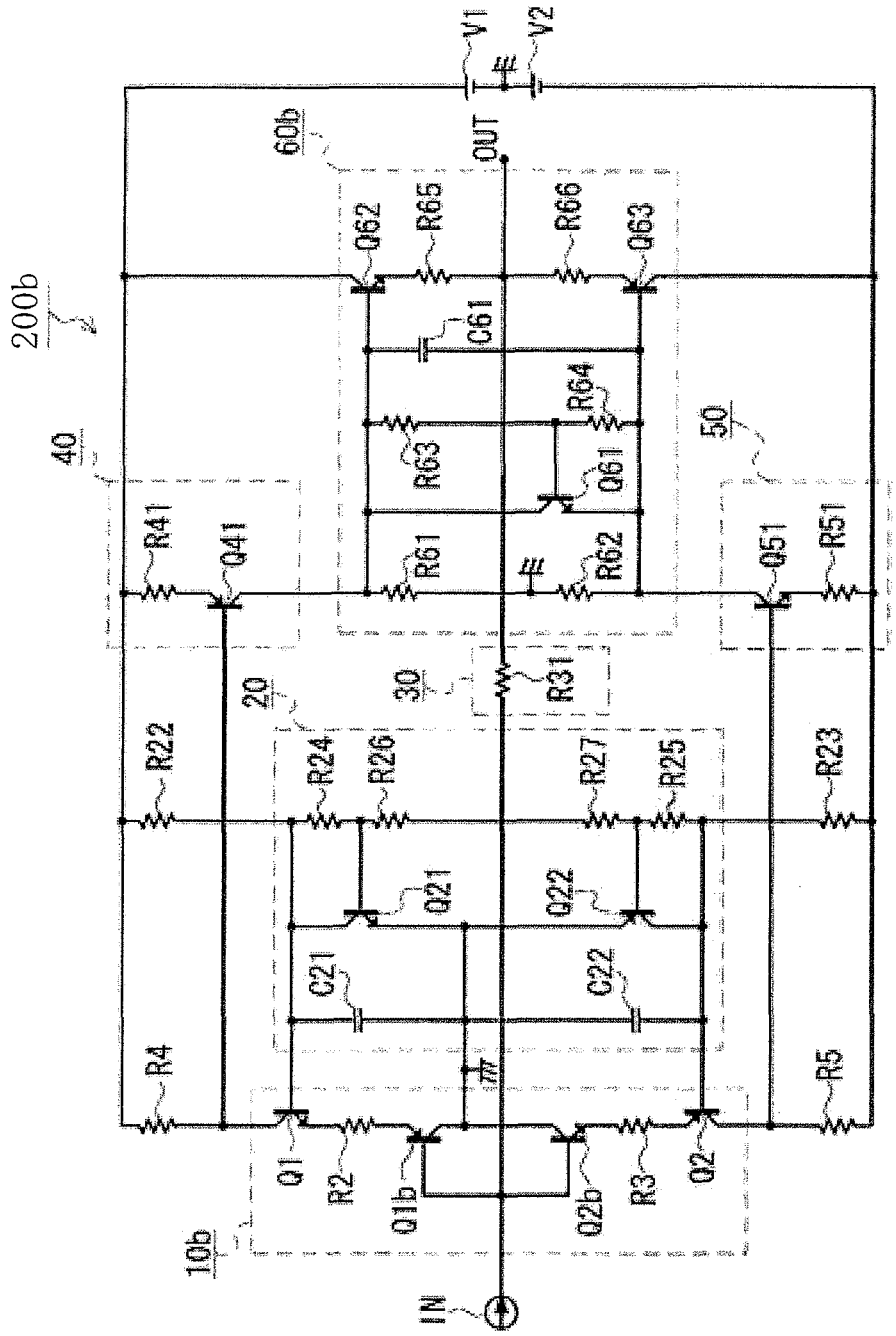
FIG. 11 is a typical circuit diagram illustrating still another example of the current-voltage conversion circuit.

FIG. 11 is a typical circuit diagram illustrating still another example of the current-voltage conversion circuit 200. A current-voltage conversion circuit 200b shown in FIG. 11 includes an input stage 10b instead of the input stage 10 of the current-voltage conversion circuit 200 shown in FIG. 9, and an output stage 60b.

Input Stage 10b

The input stage 10b includes a PNP transistor Q1b, an NPN transistor Q2b, the NPN transistor Q1, the PNP transistor Q2 and the emitter resistors R2 and R3.

As shown in FIG. 9, a base of the PNP transistor Q1b and a base of the NPN transistor Q2b are connected to the input terminal IN. A collector of the PNP transistor Q1b and a collector of the NPN transistor Q2b are connected to each other and are grounded (GND).

The emitter of the NPN transistor Q1 is connected to an emitter of the PNP transistor Q1b via the emitter resistor R2.

The emitter of the PNP transistor Q2 is connected to an emitter of the NPN transistor Q2b via the emitter resistor R3.

The collector of the NPN transistor Q1 is connected to the line of the constant power source V1 via the resistor R4, and the collector of the PNP transistor Q2 is connected to the line of the constant power source V2 via the resistor R5.

Output Stage 60b

The output stage 60b is a circuit for reducing an output impedance. The output stage 60b includes an NPN transistors Q61 and Q62, a PNP transistor Q63, resistors R61, R62, R63, R64, R65 and R66, and a capacitor C61.

A collector of the NPN transistor Q62 is connected to the line of the constant power source V1. A base of the NPN transistor Q62 is connected to the collector of the PNP transistor Q41. An emitter of the NPN transistor Q62 is connected to the output terminal OUT via the resistor R65.

A collector of the PNP transistor Q63 is connected to the line of the constant power source V2. A base of the PNP transistor Q63 is connected to a collector of the NPN transistor Q51. An emitter of the PNP transistor Q63 is connected to the output terminal OUT via the resistor R66.

An emitter of the NPN transistor Q61 is connected between the base of the PNP transistor Q63 and the collector of the NPN transistor Q51. The resistor R63 is connected between the base and the collector of the NPN transistor Q61, and the resistor R64 is connected between the base and the emitter of the NPN transistor Q61.

The capacitor C61 is provided between the base of the NPN transistor Q62 and the base of the PNP transistor Q63. Further, the resistor R61 and the resistor R62 are provided between the collector of the PNP transistor Q41 and the collector of the NPN transistor Q51. A portion between the resistor R61 and the resistor R62 are grounded (GND).

As described above, the output stage 60b whose output impedance is low, namely, the output stage whose voltage amplification is low and current amplification is high is provided. As a result, the current-voltage conversion can be efficiently performed.

Still Another Example

Figure 12:
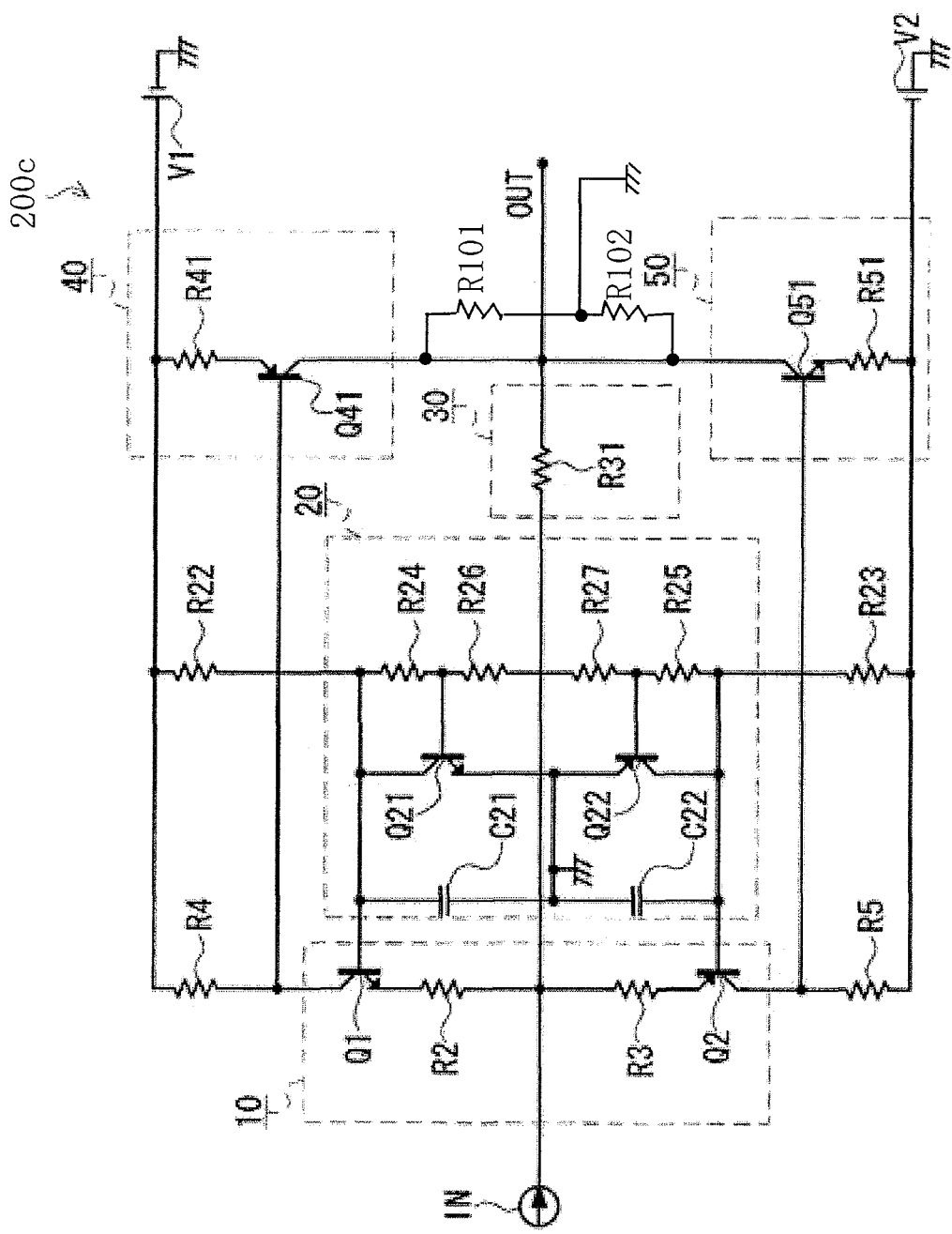
FIG. 12 is a typical circuit diagram illustrating still another example of the current-voltage conversion circuit.

As shown in FIG. 12, in comparison with FIG. 9, the current-voltage conversion circuit 200c further includes the resistors R101 and R102. One end of the resistor R101 is connected to the collector of the transistor Q41, and the other end is grounded. One end of the resistor R102 is connected to the collector of the transistor Q51, and the other end is grounded. The collectors of the transistors Q41 and Q51 are grounded via the resistors R101 and R102, so that the gains of the output stages 40 and 50 can be prevented from being fluctuated by the resistor R31 of the output resistor section 30. The resistor R101 will be described below as an example, and the same is true for the resistor R102.

The resistor R41 is an emitter resistor of the transistor Q41. A collector resistor of the transistor Q41 is represented by a resistor obtained by synthesizing the resistor R101, a collector internal resistor of the transistor Q41 and the resistor R31. When an output admittance of the transistor Q41 is denoted by hoe, the collector internal resistor is represented by (1/hoe). When a resistance value of the resistor R101 is much lower than the collector internal resistor of the transistor Q41 and the resistor R31, contribution of the resistor R101 is dominant in the collector resistor, and thus contribution of the resistor R31 is reduced.

When the resistor R101 is not connected, the resistor R31 is lower than the collector internal resistor, and the resistor R31 is dominant in the collector resistor of the transistor Q41. That is to say, the gain fluctuates due to the resistance value of the resistor R31. However, the provision of the resistor R101 can repress an influence to be exerted on the gain of the resistor R31.

In the current-voltage conversion circuits 200, 200a and 200c, the bias circuit 20 is connected between the base of the NPN transistor Q1 and the base of the PNP transistor Q2. For this reason, the bias circuit 20 is put into a pulled-up state (called also as a floating state), and a plurality of the bias circuits 20 does not have to be provided, thereby simplifying the circuit configuration of the current-voltage conversion circuits 200, 200a and 200b.

In the current-voltage conversion circuits 200, 200a of the present invention, since the temperature can be compensated in the bias circuit 20, thermal runway of the transistors is prevented. As a result, the temperature stability of the current-voltage conversion circuits 200 and 200a can be heightened.

The NPN transistor Q1 and the PNP transistor Q2 are thermally bonded to each other, so that the temperature stability of the current-voltage conversion circuits 200 and 200a can be heightened.

An amplifying amount in the current-voltage conversion circuits 200, 200a and 200b can be determined by a ratio of the resistor R2 and the resistor R4, and a ratio of the resistor R3 and the resistor R5. As a result, the resistors R2, R3, R4 and R5 are also fixed resistors, and thus linearity of the amplification of the current-voltage conversion circuits 200, 200a and 200b can be improved.

The current-voltage conversion circuits 200 and 200a according to this embodiment is designed so that the output resistor R31/amplifier gain is smaller than the resistor R2 and the resistor R3. Thus, it is not necessary to add further transistor to the input stage 10 to constitute an emitter follower. As a result, a number of parts can be reduced, and thus the circuit configuration can be simplified.

In the above embodiments, a compensating circuit is not provided, but not limited to this, and, for example, a phase compensating circuit may be provided to the output resistor R31.

What is claimed is:

1. An amplifying circuit for amplifying an input signal input from an input terminal and outputting the signal from an output terminal, the circuit comprising:
    a first transistor, a second transistor, a third transistor and a fourth transistor provided to an input stage; and
    a first bias circuit, wherein
    the input signal is input into a control terminal of the first transistor and a control terminal of the second transistor,
    a first terminal of the first transistor is connected to a first terminal of the third transistor,
    a first terminal of the second transistor is connected to a first terminal of the fourth transistor,
    a second terminal of the first transistor is connected to a first potential,
    a second terminal of the second transistor is connected to a second potential that is equal to or different from the first potential,
    a second terminal of the third transistor is connected to a third potential,
    a second terminal of the fourth transistor is connected to a fourth potential,
    the first bias circuit is connected between a control terminal of the third transistor and a control terminal of the fourth transistor.

2. The amplifying circuit according to claim 1, further comprising:
    a first resistor, a second resistor, a third resistor and a fourth resistor, wherein
    the first resistor is connected between the first terminal of the first transistor and the first terminal of the third transistor,
    the second resistor is connected between the first terminal of the second transistor and the first terminal of the fourth transistor,
    the third resistor is connected to the second terminal of the third transistor,
    the fourth resistor is connected to the second terminal of the fourth transistor.

3. The amplifying circuit according to claim 1, further comprising:
a fifth transistor, a sixth transistor, a seventh transistor and an eighth transistor, wherein
a control terminal of the fifth transistor is connected to the second terminal of the third transistor,
a control terminal of the sixth transistor is connected to a first terminal of the fifth transistor,
a control terminal of the seventh transistor is connected to the second terminal of the fourth transistor,
a control terminal of the eighth transistor is connected to a first terminal of the seventh transistor,
a first terminal of the fifth transistor and a first terminal of the sixth transistor are connected to the third potential,
a first terminal of the seventh transistor and a first terminal of the eighth transistor are connected to the fourth potential,
a second terminal of the fifth transistor is connected to a fifth potential or a second terminal of the sixth transistor,
a second terminal of the seventh transistor is connected to a sixth potential or a second terminal of the eighth transistor,
the second terminal of the sixth transistor and the second terminal of the eighth transistor are connected to the output terminal of the amplifying circuit.

4. The amplifying circuit according to claim 1, further comprising:
a negative feedback resistor,
wherein a negative feedback signal from the output terminal is supplied to the control terminal of the first transistor and the control terminal of the second transistor via the negative feedback resistor.

5. The amplifying circuit according to claim 1, further comprising:
a ninth transistor, a tenth transistor, an eleventh transistor, a twelfth transistor, a second bias circuit and a third bias circuit, wherein
a control terminal of the ninth transistor is connected to the second terminal of the third transistor,
a first terminal of the ninth transistor is connected to a first terminal of the tenth transistor,
a second terminal of the ninth transistor is connected to the third potential,
a control terminal of the eleventh transistor is connected to the second terminal of the fourth transistor,
a first terminal of the eleventh transistor is connected to a first terminal of the twelfth transistor,
a second terminal of the eleventh transistor is connected to the fourth potential,
a second terminal of the tenth transistor and a second terminal of the twelfth transistor are connected to the output terminal,
the second bias circuit is connected between the third potential and a control terminal of the tenth transistor,
the third bias circuit is connected between the fourth potential and a control terminal of the twelfth transistor.

6. The amplifying circuit according to claim 5 wherein a negative feedback signal from the output terminal is supplied to a reference point of the first bias circuit.

7. The amplifying circuit according to claim 4, further comprising:
a short-circuit protection circuit,
the short-circuit protection circuit includes a thirteenth transistor connected between the control terminal of the third transistor and the control terminal of the fourth transistor,
the thirteenth transistor is controlled from an off state into an on state according to an external signal so that the control terminal of the third transistor and the control terminal of the fourth transistor are short-circuited.

8. A current-voltage conversion circuit, comprising:
a first transistor provided to an input stage;
a second transistor provided to the input stage and having a polarity different from that of the first transistor; and
a bias circuit including two capacitors, an NPN transistor and a PNP transistor, wherein one of the two capacitors is provided between an emitter and a collector of the NPN transistor and the other one of the two capacitors is provided between an emitter and a collector of the PNP transistor, wherein
a first terminal of the first transistor and a first terminal of the second transistor are connected to an input terminal into which an input current is input,
a second terminal of the first transistor is connected to a first predetermined potential,
a second terminal of the second transistor is connected to a second predetermined potential,
the bias circuit is connected between the control terminal of the first transistor and the control terminal of the second transistor.

9. The current-voltage conversion circuit according to claim 8, further comprising:
a first resistor, a second resistor, a third resistor and a fourth resistor, wherein
the first resistor is connected between the first terminal of the first transistor and the input terminal,
the second resistor is connected between the first terminal of the second transistor and the input terminal,
the third resistor is connected to the second terminal of the first transistor,
the fourth resistor is connected to the second terminal of the second transistor.

10. The current-voltage conversion circuit according to claim 8, further comprising:
a third transistor whose control terminal is connected to the second terminal of the first transistor and whose second terminal is connected to an output terminal of the current-voltage conversion circuit,
a fourth transistor whose control terminal is connected to the second terminal of the second transistor and whose second terminal is connected to the output terminal of the current-voltage conversion circuit,
a fifth resistor having one end connected to the second terminal of the third transistor and other end to be grounded, and
a sixth resistor having one end connected to the second terminal of the fourth transistor and other end to be grounded.

11. The current-voltage conversion circuit according to claim 8, wherein the first transistor corresponds to an NPN transistor and the second transistor corresponds to a PNP transistor, and wherein the control terminal of the first transistor corresponds to the base of the first transistor and the control terminal of the second transistor corresponds to the base of the second transistor.

* * * * *